(12) United States Patent
Schulte et al.

(10) Patent No.: US 10,903,389 B2
(45) Date of Patent: Jan. 26, 2021

(54) HYDRIDE ENHANCED GROWTH RATES IN HYDRIDE VAPOR PHASE EPITAXY

(71) Applicant: Alliance for Sustainable Energy, LLC, Golden, CO (US)

(72) Inventors: Kevin Louis Schulte, Denver, CO (US); Aaron Joseph Ptak, Littleton, CO (US); John David Simon, Littleton, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/248,309

(22) Filed: Jan. 15, 2019

(65) Prior Publication Data

US 2019/0221705 A1 Jul. 18, 2019

Related U.S. Application Data

(60) Provisional application No. 62/617,349, filed on Jan. 15, 2018.

(51) Int. Cl.
| | |
|---|---|
| *H01L 31/18* | (2006.01) |
| *C30B 25/02* | (2006.01) |
| *C23C 16/30* | (2006.01) |
| *C30B 29/42* | (2006.01) |
| *C30B 25/14* | (2006.01) |
| *C30B 29/40* | (2006.01) |
| *C30B 25/16* | (2006.01) |
| *H01L 31/0735* | (2012.01) |

(52) U.S. Cl.
CPC ........ *H01L 31/1844* (2013.01); *C23C 16/301* (2013.01); *C30B 25/02* (2013.01); *C30B 25/14* (2013.01); *C30B 25/165* (2013.01); *C30B 29/40* (2013.01); *C30B 29/42* (2013.01); *H01L 31/184* (2013.01); *H01L 31/0735* (2013.01)

(58) Field of Classification Search
CPC .......................... H01L 31/1844; H01L 31/184; H01L 41/0735
See application file for complete search history.

(56) References Cited

U.S. PATENT DOCUMENTS

| | | | | |
|---|---|---|---|---|
| 4,253,887 | A | * | 3/1981 | Jolly ...................... C30B 25/02 117/99 |
| 4,368,098 | A | | 1/1983 | Manasevit |
| 4,488,914 | A | * | 12/1984 | Quinlan .............. H01L 21/0237 117/102 |
| 5,330,046 | A | | 7/1994 | Yuzawa et al. |
| 5,685,214 | A | | 11/1997 | Neff et al. |
| 7,272,333 | B2 | * | 9/2007 | Mizes ................ G03G 15/5041 399/49 |

(Continued)

OTHER PUBLICATIONS

Beaudet, A., "How do I read the solar panel specifications?", Apr. 13, 2016, retrieved online from https://www.altestore.com/blog/2016/04/how-do-i-read-specifications-of-my-solar-panel/#.XNbupCJKhhE on May 10 2019, 6 pages.

(Continued)

*Primary Examiner* — Michael Jung
(74) *Attorney, Agent, or Firm* — Sam J. Barkley (57) ABSTRACT

Presented herein are reactors for growing or depositing semiconductor films or devices. The reactors disclosed may be used for the production of III-V materials grown by hydride vapor phase epitaxy (HVPE).

9 Claims, 10 Drawing Sheets

(56) References Cited

U.S. PATENT DOCUMENTS

| | | | |
|---|---|---|---|
| 9,416,464 | B1 | 8/2016 | Dmitriev et al. |
| 9,824,890 | B2 | 11/2017 | Young et al. |
| 10,192,740 | B2 | 1/2019 | Young et al. |
| 2003/0008765 | A1 | 1/2003 | Niwa et al. |
| 2004/0047714 | A1 | 3/2004 | Poli et al. |
| 2004/0137657 | A1 | 7/2004 | Dmitriev et al. |
| 2005/0167899 | A1 | 8/2005 | Aldridge et al. |
| 2006/0011135 | A1 | 1/2006 | Dmitriev et al. |
| 2009/0178611 | A1* | 7/2009 | Arena ............... C23C 16/303 117/99 |
| 2010/0164070 | A1 | 7/2010 | Okahisa et al. |
| 2010/0279020 | A1 | 11/2010 | Melnik et al. |
| 2011/0155049 | A1 | 6/2011 | Solomon et al. |
| 2011/0259879 | A1 | 10/2011 | Hanawa et al. |
| 2013/0309848 | A1 | 11/2013 | Young et al. |
| 2015/0325430 | A1 | 11/2015 | Young et al. |
| 2016/0268129 | A1 | 9/2016 | Mori et al. |

OTHER PUBLICATIONS

Castaldini, A. et al., "The EL2 trap in highly doped GaAs:Te," Journal of Applied Physics, vol. 78, No. 11, Dec. 1995, 6 pages.

King, R. et al., "Advances in High-Efficiency III-V Multijunction Solar Cells," Advances in OptoElectronics, vol. 2007, Article ID 29523, Accepted Sep. 2007, 8 pages.

Wikipedia, "Solar cell efficiency," Jul. 22, 2017, retrieved online from https://en.wikipedia.org/w/index.php?title=solar_cell_efficiency &oldid=791811865, 7 pages.

Search Report dated Jul. 23, 2019 from corresponding PCT patent application No. PCT/US19/13669; 4 pages.

Written Opinion of the International Searching Authority dated Jul. 23, 2019 from corresponding PCT patent application No. PCT/US19/13669; 6 pages.

Deschler, M. et al., "Very Rapid Growth of High Quality GaAs, InP and Related III-V Compounds," Journal De Physique, Colloque C4, vol. 49, Sep. 1988, pp. C4-689-C4692.

Enstrom, R. et al., "Influence of gas phase stoichiometry on the properties of vapour-grown In1-xGaxP alloys," Proceedings of the 1972 Symposium on GaAs (Institute of Physics, London, 1973), vol. 17, pp. 37-47.

Fan, J. et al., "Simplified fabrication of GaAs homojunction solar cells with increased conversion efficiencies," Applied Physics Letters, vol. 36, Issue 6, Mar. 15, 1978, pp. 390-392.

Grüter, K. et al., "Deposition of High Quality GaAs Films at Fast Rates in the LP-CVD System," 1989, Journal of Crystal Growth, vol. 94, pp. 607-612.

Lourdudoss, S. et al., "Hydride Vapor Phase Epitaxy Revisited," IEEE Journal of Selected Topics in Quantum Electronics, vol. 3, No. 3, Jun. 1997, pp. 749-767.

Olsen, G.H., "Vapour-phase Epitaxy of GaInAsP," GaInAsP Alloy Semiconductors, Edited by T. P. Pearsall, 1982 John Wiley & Sons, Ltd., Chapter 1, pp. 11-25.

Schulte, K. et al., "Controlled formation of GaAs pn junctions during hydride vapor phase expitaxy of GaAs," Journal pf Crystal Growth, vol. 352, Issue 1, Aug. 2012, pp. 253-257.

Schulte, K. et al., "A Kinetic Model for GaAs Growth by Hydride Vapor Phase Epitaxy," 2016 IEEE Photovoltaics Specialists Conference, pp. 1930-1933.

Shahrjerdi, D. et al., "High-efficiency thin-film InGaP/InGaAs/Ge tandem solar cells enabled by controlled spalling technology," Applied Physics Letters, vol. 100, 2012, pp. 053901-1 through 053901-3.

Shaw, Don, "Influence of Substrate Temperature on GaAs Epitaxial Deposition Rates," 1968, Journal of the Electrochemical Society, vol. 115, No. 4, pp. 405-408.

DenBaars, S.P. et al., "Homogeneous and Heterogeneous Thermal Decomposition Rates of Trimethylgallium and Arsine and Their Relevance to the Growth of GaAs by MOCVD," Journal of Crystal Growth, vol. 77, 1986, 6 pages.

Koukitu, A. et al., "Thermodynamic Analysis of the Vapour Growth of GaAs: The Inert Gas-Hydrogen Mixed Carrier System," Japanese Journal of Applied Physics, vol. 16, No. 11, 1977, 5 pages.

Metaferia, W. et al., "Gallium arsenide solar cells grown at rates exceeding 300 urn h-1 by hydride vapor phase epitaxy," Nature Communications, doi.org/10.1038/s41467-019-11341-3, 2019, 8 pages.

Mountziaris, T. et al., "Gas-Phase and Surface Reaction Mechanisms in MOCVD of GaAs with Trimethyl-Gallium and Arsine," Journal of Electrochemical Society, vol. 138, No. 8, 1991, 15 pages.

Sato, M. et al., "Effect of precracking of organometallics and arsine on growth of GaAs," Journal of Crystal Growth, vol. 115, 1991, 5 pages.

Schulte, K. et al., "Computational fluid dynamics-aided analysis of a hydride vapor phase epitaxy reactor," Journal of Crystal Growth, vol. 434, 2016, 10 pages.

Schulte, K. et al., "High growth rate hydride vapor phase epitaxy at low temperature through use of uncracked hydrides," Applied Physics Letters, vol. 112, 2018, 5 pages.

Schulte, K. et al., "Multijunction Ga0.5In0.5P/GaAs solar cells grown by dynamic hydride vapor phase epitaxy," Progress in Photovoltaics, vol. 26, 2018, 7 pages.

Schwetlick, S. et al., "Growth Mechanisms in GaAs-VPE at Low Deposition Temperature," Crystal Research Technology, vol. 20, No. 4, 1985, 7 pages.

Simon, J. et aL, "III-V-Based Optoelectronics with Low-Cost Dynamic Hydride Vapor Phase Epitaxy," Crystals, vol. 9, No. 3, 2019, 14 pages.

Yao-Wang, L. et al., "Epitaxial Growth of High Purity GaAs in an Argon Atmosphere," Journal of Crystal Growth, vol. 70, 1984, pp. 108-111.

International Search Report and Written Opinion from related PCT patent application No. PCT/US20/37640, dated Oct. 5, 2020, 7 pages.

International Search Report and Written Opinion from related PCT patent application No. PCT/US20/37806, dated Oct. 5, 2020, 12 pages.

* cited by examiner

HYDRIDE ENHANCED GROWTH RATES IN HYDRIDE VAPOR PHASE EPITAXY

CROSS-REFERENCE TO RELATED APPLICATIONS

This application claims priority under 35 U.S.C. § 119 to U.S. Provisional Patent Application No. 62/617,349, filed on Jan. 15, 2018, the contents of which are hereby incorporated by reference in its entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Single junction GaAs solar cells exhibit record efficiencies of 29.1% and 30.5% under one-sun and concentrated illumination, respectively. However, high material and manufacturing costs restrict III-V based solar cells to specialty applications such as space power and high concentration systems, despite their many advantages over other solar technologies. It is therefore essential to reduce the cost of III-V epitaxial growth in order for these solar cells to reach much larger markets. Different pathways to reduce the cost of III-V epitaxial growth, such as high-growth-rate metalorganic vapor phase epitaxy (MOVPE) and close-spaced vapor transport (CSVT) are currently being studied.

High quality single-crystal III-V materials for optoelectronic applications such as photovoltaic devices or light-emitting diodes are typically grown by Metalorganic Chemical Vapor Deposition (MOCVD). In MOCVD, epitaxial films of desired materials are grown by a reaction between methyl metalorganic precursors of the Group III constituent and hydrides of the desired Group V constituent. Thus, for example, Gallium Arsenide (GaAs) may be grown on a substrate by providing pyrolyzed trimethylgallium ($(CH_3)_3Ga$) and introducing arsine gas ($AsH_3$) into the reaction chamber. The pyrolyzed $(CH_3)_3Ga$ leaves $Ga^{+3}$ on the substrate surface which can react with $As^{-3}$ in the arsine gas to grow single-crystal GaAs films on the substrate. While capable of growing high-quality III-V films, however, MOCVD is problematic from a commercial perspective due to the high cost of trimethyl precursors and slow film growth which limits material growth throughput.

To address these limitations with the MOCVD growth process, attention has recently turned to Hydride vapor phase epitaxy (HVPE). HVPE is an alternative to current standard industrial processes that has promise for reducing the costs of III-V epitaxy. HVPE replaces the expensive group III metalorganic precursors used in MOVPE with lower cost elemental sources, and offers the potential for higher $AsH_3$ utilization, and high growth rates for III-V materials without sacrificing material quality.

HVPE is regarded for its high growth rate and its low-cost precursor inputs. In HVPE, metal chlorides (e.g. GaCl, InCl) or trichlorides (e.g. $GaCl_3$, $InCl_3$) act as the Group III transport agent and are formed from the in situ reaction of a halide-containing molecule (typically HCl) with the elemental Group III metal (Ga, In). Group V atoms may be delivered by multiple mechanisms, typically Group V hydrides ($AsH_3$, $PH_3$), although an elemental ($As_4$) or chlorinated molecules ($AsCl_3$) may be used as well.

When provided to a substrate in a reaction chamber, GaCl and $AsH_3$ form a surface complex of GaAsCl on the substrate which may be subsequently reduced by available hydrogen to form a single-crystal GaAs film and HCl(g). In the same manner, GaCl and $PH_3$ may form single-crystal GaP and HCl(g), while GaCl, InCl, and $PH_3$ may form single-crystal GaInP and HCl(g) and GaCl, InCl, and $AsH_3$ may form single-crystal GaInAs and HCl(g). The reduction step is thought to be the rate-limiting step of III-V crystal growth, with a large kinetic barrier of about 200 kJ/mol. Accordingly, HVPE deposition typically requires growth temperatures in excess of 750° C. in order to achieve growth rates greater than 1 μm/min, which is desirable for large-area/low-cost applications such as photovoltaic devices. Temperatures in that range are generally incompatible with the growth of important ternary alloys such as GaInP, because GaP-rich alloys are thermodynamically favored as temperatures increase.

It has been hypothesized that delivery of 'uncracked' Group V hydrides such as $AsH_3$ or $PH_3$—that is, in the case of $AsH_3$, molecular $AsH_3$, as opposed to thermally-degraded $As_2/As_4$ along with a stoichiometric amount of $H_2$ to the growth substrate is important to increasing III-V material growth rates in HVPE deposition chambers. While the precise mechanism by which uncracked $AsH_3$ and $PH_3$ may catalyze film growth is not well understood, it is theorized that cracking of $AsH_3$ or $PH_3$ on the substrate surface could lead to a large number of hydrogen radicals which reduce Cl in, for example, the GaAsCl surface complex and thereby accelerate the rate-limiting reduction step. Furthermore, the equilibrium constant for GaAs growth directly from $AsH_3$ is roughly four orders of magnitude higher than for GaAs growth from cracked $As_4$.

Currently, no HVPE reaction chamber has been designed to deliver uncracked Group V hydride gases to the surface of the growth substrate. Delivering uncracked Group V hydrides to the substrate is not a trivial challenge. Arsine, for instance, is thermally unstable at about 400° C., which is much lower than typical HVPE deposition temperatures which may be in excess of 700° C. Previous work by others experimented with reaction parameters to facilitate improved delivery of uncracked $AsH_3$ to the substrate and demonstrated high GaAs growth rates at 700° C. with normal reactant flow rates by reducing the reactor pressure below 8 torr, leading to decreased $AsH_3$ residence time, and therefore a lower percentage of cracked $AsH_3$ in the reactor before reaching the substrate surface. Significant vacuum of this nature increases the complexity and expense of the HVPE deposition process, however, while also greatly constraining design flexibility that may be more beneficially applied elsewhere in the reactor.

Similarly, others have delivered $PH_3$ downstream (T=650° C.) of the InCl injection point (T=700° C.) rather than upstream of it, thereby avoiding passing the $PH_3$ through the high temperature region of the reactor, and observed growth rate improvements in excess of 5× typically observed, while others have observed a similar effect during GaInP growth.

Previously, Gruter et al. demonstrated GaAs growth rates up to 300 μm/h in their vacuum HVPE system. Their reactor made no attempt to deliver the $AsH_3$ precursor at low temperature or at high velocity to avoid thermal cracking of $AsH_3$. Instead, they avoided $AsH_3$ cracking through use of extremely low reactor pressures, which enable a long mean-free-path for input precursor molecules that limits molecular collisions and thus suppresses AsH₃ cracking. Reactor pressures below 0.01 atm. were necessary to avoid cracking and achieve such high growth rates. However, a pressure that low places significant constraints on the reactor geometry and materials that can be used in its construction, and makes the reactor more expensive to operate than an atmospheric pressure reactor.

SUMMARY

In an aspect, disclosed herein is a reactor capable of the deposition of at least one layer of a semiconductor device by using hydride vapor phase epitaxy (HVPE), wherein the reactor is capable of producing the at least one layer of a semiconductor device at a rate of greater than 300 μm/h at a pressure of about 1 atm. In an embodiment, the reactor has a group V hydride injector inlet, a group V hydride outlet and source boats. In an embodiment, the reactor has a high temperature region and a low temperature region wherein the high temperature region contains the source boats and wherein the low temperature region contains the group V hydride injector outlet. In another embodiment, the reactor has a high temperature region is at a temperature of up to about 750° C., and a low temperature region that is at a temperature of below about 650° C. In an embodiment, the reactor has a low temperature region that is where the at least one layer of a semiconductor device is deposited. In yet another embodiment, the reactor has at least one layer of a semiconductor device that are III-V semiconductors. In an embodiment, the reactor has a at least one layer of a semiconductor device that is selected from the group consisting of GaAs and GaInP. In another embodiment, the reactor has the at least one layer of a semiconductor device that is a single-junction GaAs solar cell having an efficiency of about 25% or greater. In another embodiment, the reactor has the at least one layer of a semiconductor device that has an open circuit voltage (VOC) of greater than 1.04 V. In an embodiment, the reactor has the at least one layer of a semiconductor device that has a fill factor of at least 80%. In another embodiment, the reactor has the at least one layer of a semiconductor device that contains an anti-reflective coating. In an embodiment, the reactor has the at least one layer of a semiconductor device that has a band gap voltage offset (WOC) of less than 0.4V. In yet another embodiment, the reactor has the at least one layer of a semiconductor device that has a band gap voltage offset (WOC) of less than about 0.33V. In an embodiment, the reactor has the at least one layer of a semiconductor device that has a EL2 trap density of less than about 0.4×1015 cm-3 at growth rates up to about 320 μm/h.

In an aspect, disclosed herein is a method for growing at least one layer of a semiconductor device using a reactor having boats containing group III metals, a group V hydride gas, a low temperature growth region and a high temperature region wherein the method comprises hydride vapor phase epitaxy (HVPE), and heating the group V hydride gas to a temperature of at least 750° C., and growing the at least one layer of a semiconductor device in the low temperature growth region wherein the low temperature growth region is below about 650° C. In an embodiment, the method makes the at least one layer of a semiconductor device in which it is grown at a rate of greater than 300 μm/h at a pressure of about 1 atm. In another embodiment, the method makes the at least one layer of a semiconductor device that has a band gap voltage offset (WOC) of less than 0.4V. In another embodiment, the method makes the at least one layer of a semiconductor device that has a band gap voltage offset (WOC) of less than about 0.33V. In an embodiment, the method makes the at least one layer of a semiconductor device that is a single-junction GaAs solar cell having an efficiency of about 25% or greater. In yet another embodiment, the method makes the at least one layer of a semiconductor device that has a EL2 trap density of less than about 0.4×1015 cm-3 at growth rates up to about 320 μm/h.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 5 depicts the identification of the layers in which the growth rate was varied.

FIGS. 7(a) and 7(b) depict J-V data for GaAs solar cells grown using the same H₂Se dopant flow and a growth rate of about 180 μm/h in the contact layer (red curve) compared with a device grown using a relatively slow growth rate of about 50 μm/h (black curve).

FIGS. 10(a) and 10(b) depict certified I-V characteristics of single junction GaAs cells grown at growth rate of (a) 50

μm/h on 4° B miscut substrate and (b) 195 μm/h on 6° B miscut substrate with a MgF$_2$/ZnS antireflection coating measured under the AM1.5G spectrum (certified by the PV performance characterization team at the National Renewable Energy Laboratory).

DETAILED DESCRIPTION

D-HVPE is a modified HVPE deposition technique in which the growth substrate is rapidly transferred between adjacent environmentally-isolated deposition chambers. D-HVPE can be used to form such heterointerfaces by avoiding pauses in film growth, as each reaction chamber may be maintained at a distinct temperature. In an embodiment, disclosed herein are methods for making semiconductors using D-HVPE at temperatures less than about 700° C. to obtain a lattice-matched composition Ga$_{0.5}$In$_{0.5}$P without use of high InCl or GaCl ratios to drive the reaction. The ability to grow GaAs at lower temperatures while maintaining a high film growth rate by using D-HVPE is a cost-effective method of III-V material growth, and furthermore is a step in the manufacture of more complicated device architectures that require abrupt heterointerfaces such as tandem photovoltaic devices utilizing both GaAs and GaInP absorber layers.

Figure 10A:
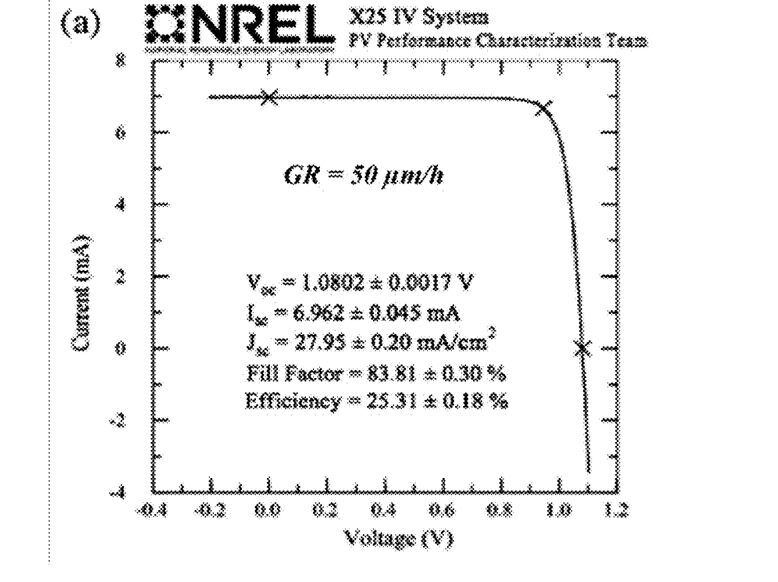

Open circuit voltage ($V_{OC}$) is a device parameter that is indicative of the quality of a specific material type, but, because this parameter is a function of band gap ($E_G$), using $V_{OC}$ to compare the quality of different materials with different $E_G$ is not straightforward. Therefore, the band gap voltage offset ($W_{OC}=E_G/q-V_{OC}$, where q is the elementary charge) is more commonly used to quantify material quality in a general form that allows for comparison among different material types. $W_{OC}<0.4$ V is generally regarded as a threshold for "excellent" material quality. In an embodiment, semiconductor materials, such as GaAs solar cells, made using reactors and methods as disclosed herein had $W_{OC}$ of from about 0.33V to about 0.35 V. In an embodiment, the semiconductor depicted in 10(*a*) has a $V_{OC}$ of 1.08 V and a $W_{OC}$ of 0.33 V.

In an embodiment, GaAs growth rates in excess of 300 μm/h by atmospheric-pressure D-HVPE at 650° C. are obtained using methods and reactors disclosed herein. These rates are higher than previously achieved by low pressure, traditional HVPE. A combination of enhanced growth rates and increased material utilization was achieved by using methods disclosed herein such as by controlling the flow of hydrogen carrier gas. The $V_{OC}$ of single junction GaAs solar cells grown from about 35-309 μm/h was in the range of about 1.04-1.07 V indicating low levels of non-radiative recombination regardless of growth rate. As disclosed herein, DLTS measurements identified only EL2 traps with concentration of less than about $3\times10^{14}$ cm$^{-3}$ and with no significant increase with increasing growth rate, showing the quality of D-HVPE devices grown at high rates using methods disclosed herein.

In an embodiment, reaction chambers are disclosed herein which were designed to optimize high quality III-V material film growth in HVPE or D-HVPE depositions by delivering to the growth substrate uncracked Group V hydride precursors in a cost-effective manner.

In an embodiment, a reactor for deposition of multiple layers of a semiconductor device using HVPE is disclosed wherein the reactor has chamber walls, a group V hydride injector inlet, source boats, and a bottom group V hydride injector outlet. In another embodiment, a reactor has a high temperature region at a temperature of about 750° C., and a low temperature region at a temperature of about 500° C. In another embodiment, the reactor has one or more group V hydride injector outlets located in the low temperature region. In another embodiment, the reactor temperature regions are heated by an optical heating source. In an embodiment, the reactor has a deposition chamber comprising a perforated structure which is located beneath a growth substrate. In yet another embodiment, the reactor has a perforated structure that is in the shape of a ring, a triangle, or a square.

In an embodiment, disclosed herein are methods of performing HVPE deposition of layers of a semiconductor device using a reactor is disclosed wherein the method provides deposition materials and carrier gas flows.

In an embodiment, an in-line, continuous reactor for deposition of multiple layers of a semiconductor device using HVPE is disclosed having chamber walls, a group V hydride injector inlet, source boats, and a bottom group V hydride injector outlet. In an embodiment, the reactor of has a high temperature region at a temperature of about 750° C., and a low temperature region at a temperature of about 500° C. In another embodiment, the reactor has one or more group V hydride injector outlets located in the low temperature region. In another embodiment, the reactor has temperature regions that are heated by an optical heating source. In an embodiment, the reactor is configured to linearly move a substrate via a substrate transport mechanism through one or more deposition regions. In another embodiment, the reactor has components of the deposition chamber that are inverted such that the high temperature region is located below the substrate transport mechanism. In an embodiment, the reactor has a deposition chamber with a perforated structure which is located beneath a growth substrate. In yet another embodiment, the reactor has a perforated structure that is in the shape of a ring, a triangle, or a square.

In an embodiment, disclosed herein are methods of performing HVPE deposition of layers of a semiconductor device using novel reactors using deposition materials and carrier gas flows.

Figure 1:
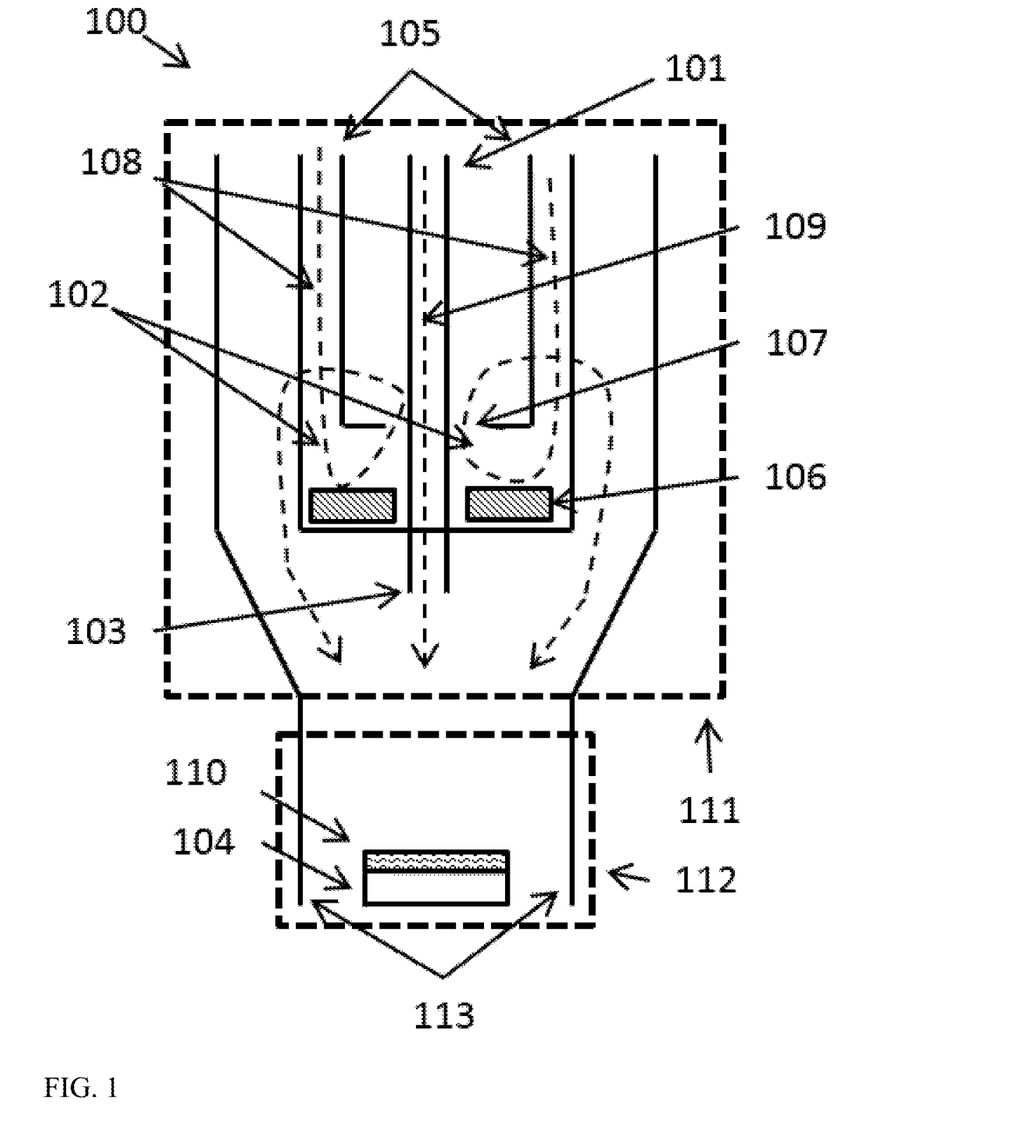
FIG. 1 depicts a HVPE deposition chamber which is defined by chamber walls and includes a Group V hydride injector inlet, source boats, and a bottom Group V hydride injector outlet.

FIG. 1 is a depiction of a HVPE deposition chamber 100 which is defined by chamber walls 113 and includes a Group V hydride injector inlet 101, source boats 102, and a bottom Group V hydride injector outlet 103. The HVPE deposition chamber may have a generally high temperature region 111, which may be about 750° C., and a generally lower temperature region 112, which may be about 500° C. In some embodiments of the invention, the high temperature region 111 and the low temperature region 112 are heated by an optical heating source which does not supply a convective or conductive heat transfer source to the deposition chamber 100. The Group V hydride precursor gas (e.g. arsine or phosphine) may be supplied to the deposition chamber 100 from an external source through the top Group V hydride injector inlet 101 located at the top of the deposition chamber 100 and delivered, through the high temperature region 111, to the substrate 104 from the bottom Group V hydride injector outlet 103 as shown in flow pathway 109. In some embodiments, the Group V hydride source may be refrigerated or otherwise configured to deliver low temperature Group V hydride gas to the Group V hydride injector inlet 101. In an embodiment, the Group V hydride injector outlets are located above the source boats. In another embodiment, the Group V hydride injector outlets are located above the Group III metal. GaCl or InCl may be delivered to the substrate by passing HCl(g) from an external source (not shown) through HCl inlet 105 to either or both source boats 103, which contain the Group III metal (e.g. Ga, In) 106. The HCl(g) reacts with the Group III metal to form, for example, GaCl(g), which exits the source boat 102 through the source boat aperture 107 and recirculates into the deposition chamber 100 in the high temperature region 111 behind HCl inlet 105 as shown by flow pathway 108. In some embodiments of the invention, HCl(g) flow pathway 108 may be independently heated such that HCl(g) or reacted GaCl(g) or InCl(g) is delivered to the deposition chamber 100 at a temperature above the ambient in the high-temperature region 111. The HCl(g) flow pathway 108 and Group V hydride flow pathway 109 may converge on substrate 104 in the lower temperature region 112 to deposit the desired III-V material (e.g. GaAs) 110.

In some embodiments, deposition chamber 100 may be inverted, such that substrate 104 and low-temperature region 112 are located above the high-temperature region 111 and Group V hydride injector outlet 103. In this embodiment, Group V hydride flow pathway 109 and HCl(g) pathway 108 flow upward from below the substrate 104 to deposit the desired III-V material 110 on the bottom of substrate 104.

Multiple HVPE deposition chambers 100 may be environmentally isolated and placed in series, which may enable the more efficient deposition of layers comprising distinct material compositions and various temperatures by moving the substrate sequentially through individual chambers. For example, a thick photovoltaic absorber layer may be grown in a deposition chamber 100 configured to maximize the III-V material 110 growth rate, while a subsequently grown thinner layer (e.g. a tunnel junction) may be grown in another discrete, serially-connected, deposition chamber 100 configured to more precisely control the III-V material's 110 growth rate. Serially connected deposition chambers 100 may be controllably environmentally connected, such that precursor gas present in one deposition chamber 100 may controllably flow to one or more subsequent serially connected deposition chambers 100. For example, uncracked Group V hydride precursor gas present in a first deposition chamber 100 may be delivered to one or more subsequent deposition chambers 100 in order to more efficiently utilize the stock of initial precursor material.

In an embodiment, reactors disclosed herein are capable of growth in up to about one atmosphere. In other embodiments, reactors disclosed herein are capable of growth in up to about ten atmospheres or more. In another embodiment, higher quality films are grown at lower temperatures than those previously disclosed.

Figure 2:
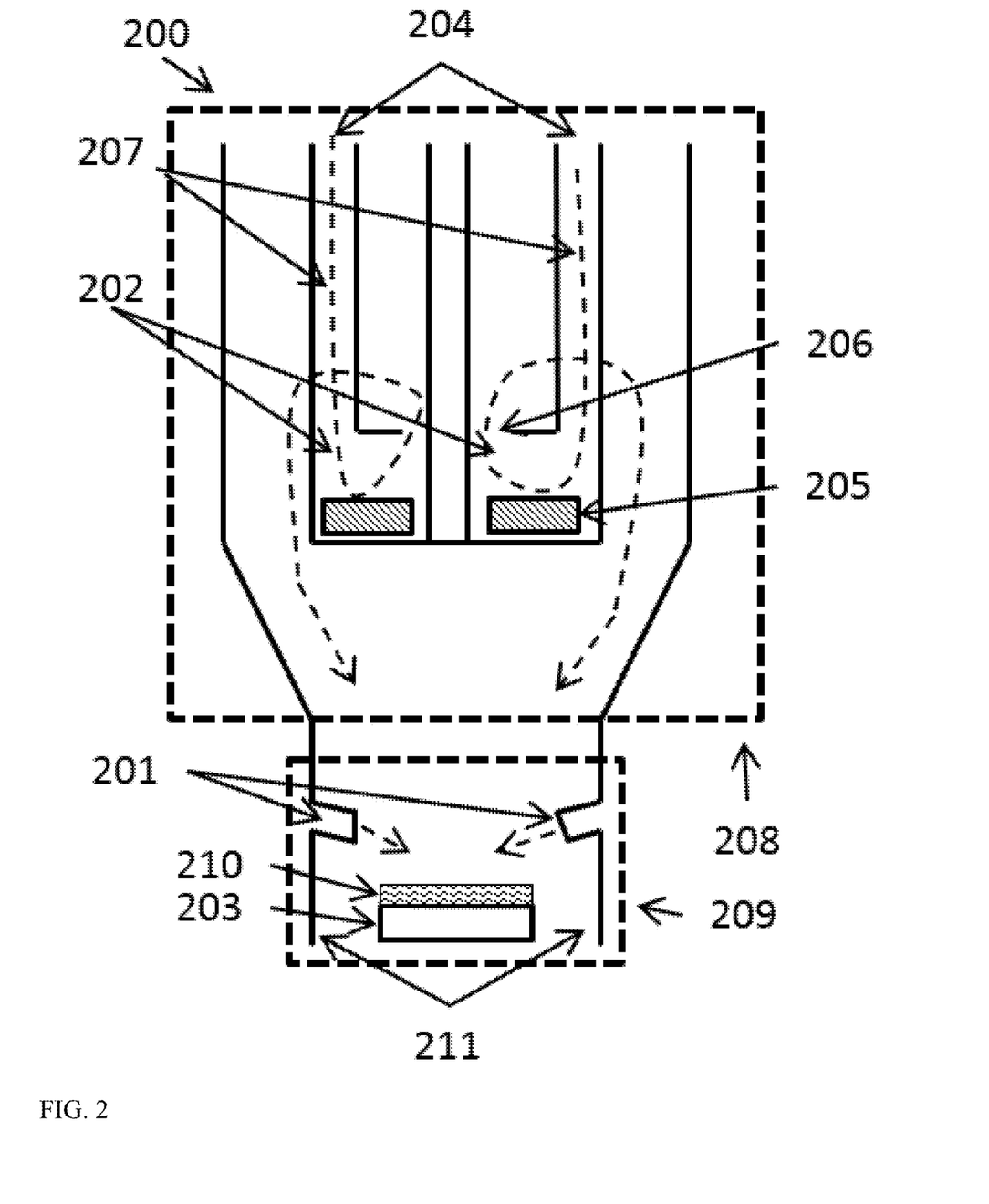
FIG. 2 depicts a HVPE deposition chamber which is defined by chamber walls and includes a high temperature region and a low temperature region. In an embodiment, multiple Group V hydride injector outlets are included radially around the growth substrate in order to enhance film growth uniformity.

FIG. 2 is a depiction of a HVPE deposition chamber 200, which is defined by chamber walls 211 and includes a high-temperature region 208 and a low temperature region 209. In some embodiments of the invention, the high temperature region 208 and the low temperature region 209 are heated by an optical heating source which does not supply a convective or conductive heat transfer source to the deposition chamber 200. HVPE deposition chamber 200 includes one or more Group V hydride injector outlets 201, which are located in the low temperature region 209 of deposition chamber 200. By moving the Group V hydride injector outlets 201 into the lower temperature region, as well as closer to the growth substrate 203, it is expected that delivery of uncracked Group V hydride precursor gas to the growth substrate 203 will be enhanced. Moreover, it may be desirable that multiple Group V hydride injector outlets 201 be included radially around the growth substrate 203 in order to enhance film 210 growth uniformity.

In all other aspects, deposition chamber 200 functions similarly to deposition chamber 100, in that GaCl or InCl may be delivered by passing HCl(g) from an external source through HCl inlet 204 to either or both source boats 202, which contain a Group III metal (e.g. Ga, In) 205. The HCl(g) reacts with the Group III metal to form, for example, GaCl(g), which exits the source boat 202 through the source boat aperture 206 and recirculates into the deposition chamber 200 in the high temperature region 208 behind HCl inlet 204 as shown by flow pathway 207. In some embodiments of the invention, HCl(g) flow pathway 207 may be independently heated such that HCl(g) or reacted GaCl(g) or InCl(g) is delivered to the deposition chamber 200 at a temperature above the ambient in the high temperature region 208. The HCl(g) flow pathway 207 can then converge on substrate 203 with the Group V hydride supplied through Group V hydride injector outlet 201 in the lower temperature region 209 to deposit the desired III-V material (e.g. GaAs) 210. As in deposition chamber 100, the Group V hydride is supplied from an external source which may be refrigerated or otherwise configured to deliver low-temperature Group V hydride to the Group V hydride injector outlet 201.

In some embodiments, deposition chamber 200 may be inverted, such that substrate 203 and low temperature region 209 are located above the high temperature region 208 and Group V hydride injector outlet 201. In this embodiment, HCl(g) pathway 207 flows upward from below the substrate 203 to deposit the desired III-V material 210 on the bottom of substrate 203.

Multiple deposition chambers 200 may be environmentally isolated and placed in series which may enable the more efficient deposition of layers having distinct material compositions and various optimal growth temperatures by moving the substrate sequentially through individual chambers. For example, a thick photovoltaic absorber layer may be grown in a deposition chamber 200 configured to maximize the III-V material 210 growth rate, while a subsequently grown thinner layer (e.g. a tunnel junction) may be grown in another discrete, serially connected, deposition chamber 200 configured to more precisely control the III-V material 210 growth rate. Further, serially connected deposition chambers 200 may be controllably environmentally connected, such that precursor gas present in one deposition chamber 200 may controllably flow to one or more subsequent serially connected deposition chambers 200. For example, uncracked Group V hydride precursor gas present in a first deposition chamber 200 may be delivered to one or more subsequent deposition chambers 200 in order to more efficiently utilize the stock of initial precursor material.

Figure 3:
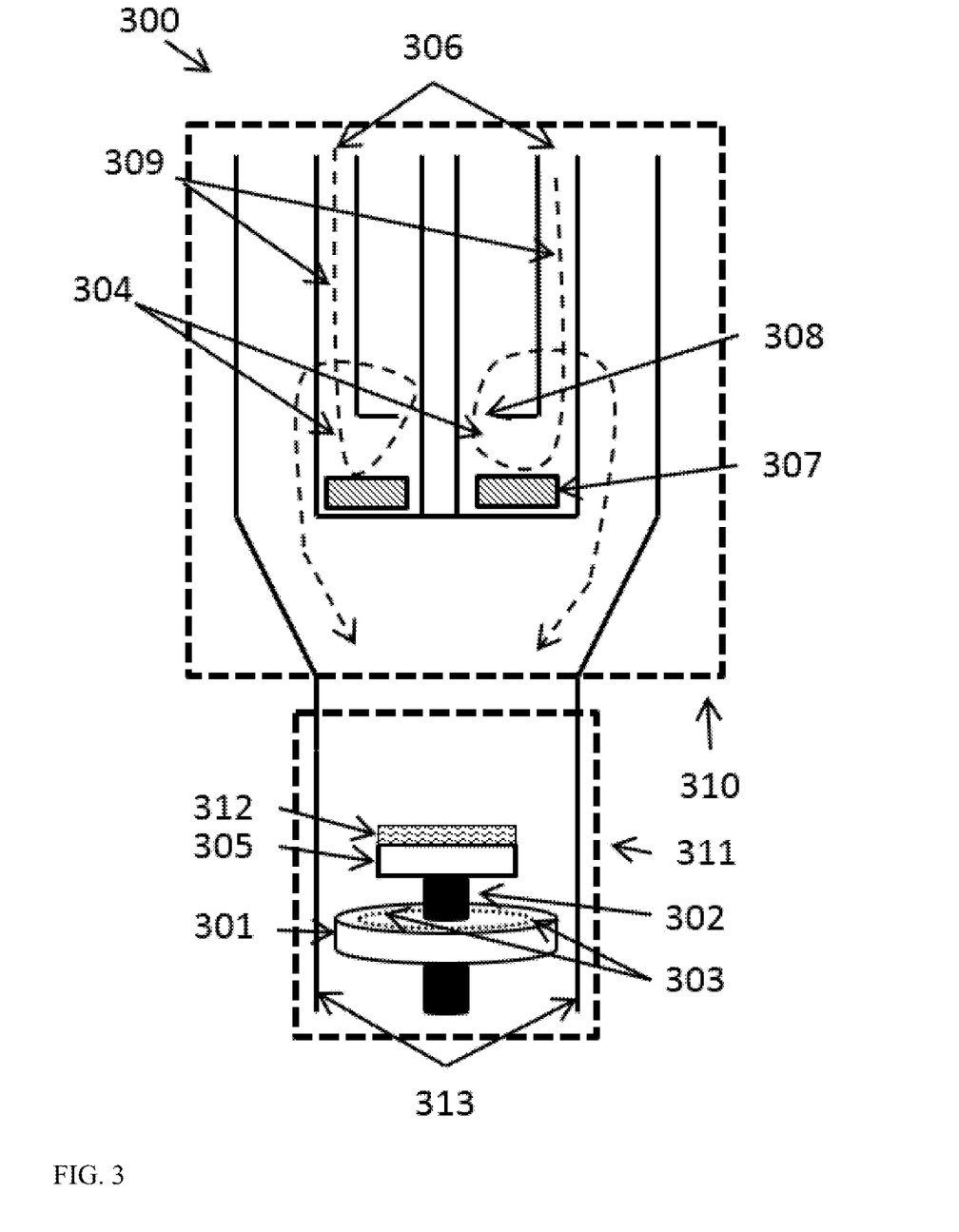
FIG. 3 depicts a HVPE deposition chamber which is defined by chamber walls and includes a high temperature region and a low temperature region. HVPE deposition chamber may include a perforated structure attached to a support structure located beneath the growth substrate.

FIG. 3 is a depiction of a proposed HVPE deposition chamber 300, which is defined by chamber walls 313 and includes a high temperature region 310 and a low temperature region 311. In some embodiments, the high temperature region 310 and the low temperature region 311 are heated via an optical heating source which does not supply a convective or conductive heat transfer source to the deposition chamber 300. HVPE deposition chamber 300 includes a perforated structure 301 attached to a support structure 302, which is located beneath the growth substrate 305. Perforated structure 301 may include multiple perforations 303 through which Group V hydride can be supplied from an external source to the deposition chamber 300 in the low temperature region 311. In some embodiments, the Group V hydride source may be refrigerated or otherwise configured to deliver low temperature Group V hydride to the multiple perforations 303. Perforated structure 301 can be of any desired shape including, for example, a ring, a triangle, a square, or any other shape which may be desirable for uniformly depositing the desired III-V material 312. Similarly, perforations 303 may be of any size or shape required in order to supply Group V hydride precursor gas to the deposition chamber 300 in the necessary quantity or flow rate. Moreover, the configuration of perforations 303 may be in any shape or pattern which is designed to increase the spatial uniformity or otherwise contribute to the improved growth of the desired III-V material 312. Perforated structure 301 may be located at any depth below growth substrate 305 which facilitates improved growth of III-V material 312 at the chosen growth temperature, flow rates, etc. In some embodiments, placing the perforated structure 301 at a location above the growth substrate 305 will be desirable.

In an embodiment, deposition chamber 300 functions similarly to deposition chambers 100 and 200, in that GaCl or InCl may be delivered by passing HCl(g) from an external source through HCl inlet 306 to either or both source boats 304, which contain the Group III metal (e.g. Ga, In) 307. The HCl(g) reacts with the Group III metal to form, for example, GaCl(g), which exits the source boat 304 through the source boat aperture 308 and recirculates into the deposition chamber 300 in the high temperature region 310 behind HCl inlet 306 as shown by flow pathway 309. In some embodiments of the invention, HCl(g) flow pathway 309 may be independently heated such that HCl(g) or reacted GaCl(g) or InCl(g) is delivered to the deposition chamber 300 at a temperature above the ambient in the high temperature region 310. The HCl(g) flow pathway 309 can then converge on substrate 305 with the Group V hydride supplied through the perforations 303 on perforated structure 301 in the lower temperature region 311 to deposit the desired III-V material (e.g. GaAs) 312.

In some embodiments, deposition chamber 300 may be inverted, such that substrate 305 and low temperature region 311 are located above the high temperature region 310. In an embodiment, HCl(g) pathway 309 flows upward from below the substrate 305 to deposit the desired III-V material 312 on the bottom of substrate 305. The perforated structure 301 may be located above or below the substrate 305.

Multiple deposition chambers 300 may be environmentally isolated and placed in series which may enable the more efficient deposition of layers comprising distinct material compositions, at various temperatures, by moving the substrate sequentially through individual chambers. For example, a thick photovoltaic absorber layer may be grown in a deposition chamber 300 configured to maximize the III-V material 312 growth rate, while a subsequently grown thinner layer (e.g. a tunnel junction) may be grown in another discrete, serially-connected, deposition chamber 300 configured to more precisely control the III-V material's 312 growth rate. Further, serially connected deposition chambers 300 may be controllably environmentally connected, if desired, such that precursor gas present in one deposition chamber 300 may controllably flow to one or more subsequent serially-connected deposition chambers 300. For example, uncracked Group V hydride precursor gas present in a first deposition chamber 300 may be delivered to one or more subsequent deposition chambers 300 in order to more efficiently utilize the stock of initial precursor material.

Figure 4:
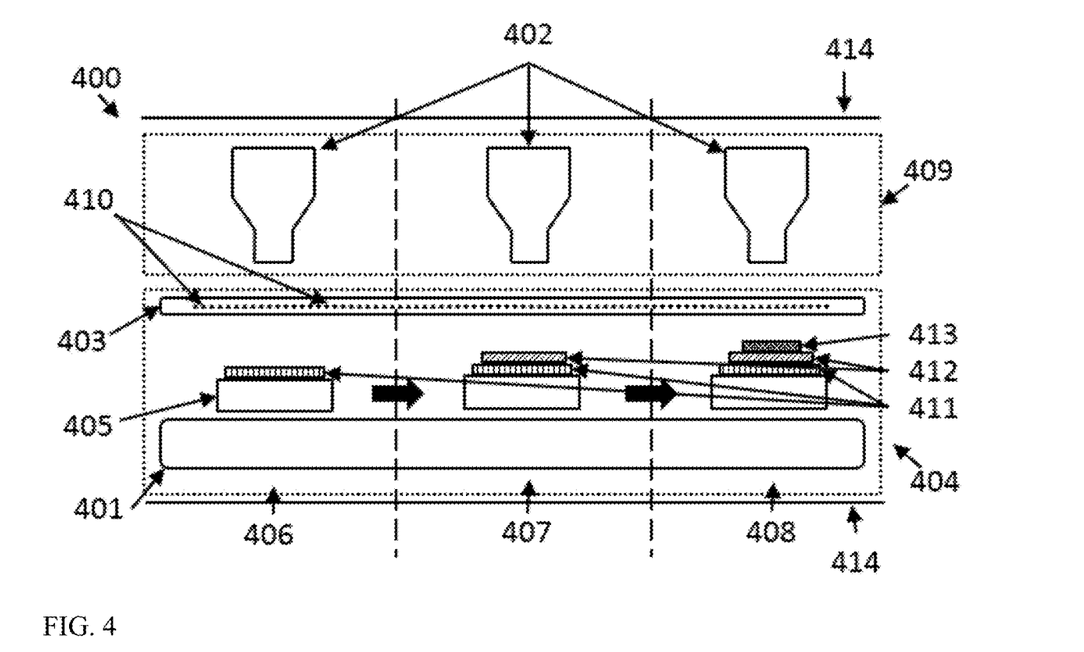
FIG. 4 depicts a continuous HVPE deposition chamber defined by chamber walls and has a substrate transport mechanism, two or more gas delivery apertures, and a Group V hydride delivery channel, as well as a high temperature region and a low temperature region. In some embodiments, the substrate transport mechanism may encircled by an inductive heating coil which serves as, or part of, the heating element for the low-temperature region.

An in-line, continuous deposition chamber 400 is shown in FIG. 4. Continuous deposition chamber 400 is defined by chamber walls 414 and comprises a substrate transport mechanism 401, two or more GaCl(g)/InCl(g) delivery apertures 402, and a Group V hydride delivery channel 403, as well as a high temperature region 409 and a low temperature region 404. In some embodiments of the invention, the high temperature region 409 and the low temperature region 404 are heated via an optical heating source which does not supply a convective or conductive heat transfer source to the deposition chamber 400. In further embodiments of the invention, the substrate transport mechanism 401 may be encircled by an inductive heating coil which serves as, or part of, the heating element for the low temperature region 404.

The substrate transport mechanism 401, located in a low temperature region 404, may be configured to linearly move a substrate 405 through one or more deposition regions 406, 407, and 408. In some embodiments of the invention, substrate transport mechanism 401 is a conveyor belt. In further embodiments of the invention, the substrate transport mechanism 401 may be located above the Group V hydride delivery channel 403 and may be permeable to gas flow for facile film growth. Each GaCl(g)/InCl(g) delivery aperture 402 is located in a high temperature region 409 and may be configured to deliver GaCl(g) and/or InCl(g) to the continuous deposition chamber 400. In some embodiments, GaCl (g)/InCl(g) delivery aperture 402 may operate substantially the same as deposition chambers 100, 200, and 300, provided the GaCl(g) and/or InCl(g) is here delivered to the deposition chamber 400 at large (as opposed to directly to the substrate) and does not include a Group V hydride component. In an embodiment, one or more sequential deposition regions 406, 407, and 408 may be characterized by each having a GaCl(g) or InCl(g) flow rate, Group V hydride or PH₃ flow rate, temperature, substrate residence time, substrate transport mechanism 401 path length, or any other unique growth parameter configured to preferentially deposit a III-V material at the desired quality, composition, spatial uniformity, or other desirable film characteristic.

Group V hydride delivery channel 403, located in low-temperature region 404, may be a simple conduit configured to permit fluid flow of Group V hydride precursor gas, from an external source. In some embodiments, the Group V hydride source may be refrigerated or otherwise configured to deliver low temperature Group V hydride precursor gas to the Group V hydride delivery channel 403. Group V hydride delivery channel 403 may include one or more perforations 410 which are of a number, size, and shape configured to deliver a desired amount of Group V hydride precursor gas to the substrate 405. In some embodiments, Group V hydride delivery channel 403 is configured such that the rate of Group V hydride supplied to the substrate 405 is controllable in each deposition region 406, 407, and 408.

GaCl(g) or InCl(g) supplied by GaCl(g)/InCl(g) delivery aperture 402 from high temperature region 409 may interact with Group V hydride precursor gas supplied by Group V hydride delivery channel 403 in the low temperature region 404 at the substrate 405 in a first desired deposition region 406 to deposit a first III-V material 411. After the first III-V material 411 is deposited, the substrate 405 can be moved along the substrate transport mechanism 401, to a second deposition region 407, in which a second III-V material 412 may be deposited. GaCl(g) or InCl(g) may be supplied by either the same or a unique GaCl(g)/InCl(g) delivery aperture 402 as may be desired for the composition or quality of the second III-V material 412. After the second III-V material 412 is deposited, the substrate 405 can be further moved along the substrate transport mechanism 401 to a third deposition region 408, in which a third III-V material 413 may be deposited as previously set forth in deposition regions 406 and 407. In some embodiments, there may be n sequential deposition regions corresponding n layers of desired III-V materials in the completed device stack.

In further embodiments of deposition chamber 400, the components of deposition chamber 400 may be inverted, such that the GaCl(g)/InCl(g) delivery aperture 402 and the high temperature region 409 are located below the substrate transport mechanism 401 and Group V hydride delivery channel 403 in the low-temperature region 404. In this embodiment, substrate 405 and Group V hydride delivery channel 403 may be located on the bottom of substrate transport mechanism 401 to facilitate precursor gas flow to the substrate 405 surface. Substrate 405 may be affixed to the substrate transport mechanism 401 by any suitable mechanical, chemical, or other means as may desirable.

In an embodiment GaAs growth rates in excess of 300 µm/h were obtained using D-HVPE with GaAs solar cells grown at these rates showing insignificant degradation in $V_{OC}$, which was used as a proxy for overall material quality, compared to devices grown using lower rates.

In an embodiment, growth experiments were performed in a dual-chamber D-HVPE system. The sources used in the D-HVPE system were $AsH_3$ and $PH_3$ for the group V sources, and GaCl and InCl, which are formed in situ by flowing anhydrous HCl over Ga and In metal, as the group III sources. In an embodiment, the dopants used were Zn (p-type) and Se (n-type) supplied as diethylzinc and $H_2Se$, respectively. The source zone where the metal chlorides are formed was held at 800° C., while the deposition zone (growth temperature, $T_G$) was held at 650° C. for materials grown.

Growth rate studies were conducted by growing lattice matched GaAs/GaInP/GaAs structures on (100) GaAs substrates miscut 4° towards (111)B. Growth rates were determined by selectively etching a portion of the top GaAs layer to the GaInP etch stop and using the GaAs thickness measured using stylus profilometry and the known growth time. Changes in growth rate were studied as functions of gas flows in the reactor, including GaCl flow and the flow of $H_2$ carrier gas injected into different parts of the system.

Figure 5:
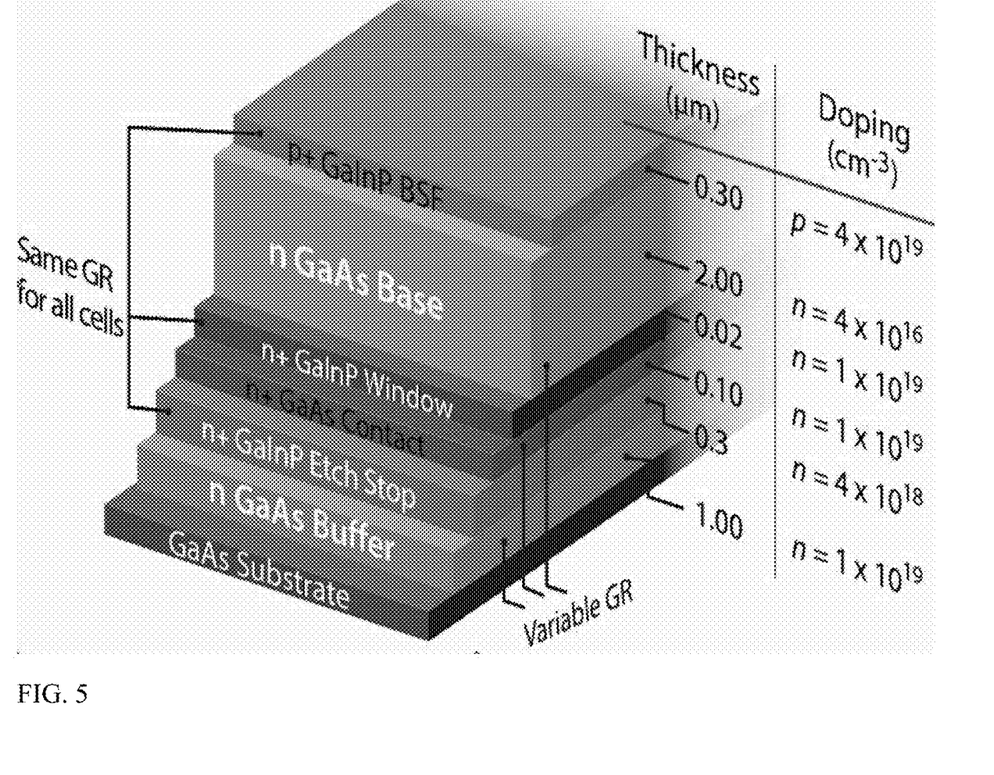
FIG. 5 depicts a device structure grown in an inverted configuration of an embodiment of GaAs rear heterojunction solar cells disclosed herein.

In an embodiment, single junction GaAs solar cells were grown in an inverted configuration with lattice matched GaInP window and back surface field (BSF) layers in a rear heterojunction design. In an embodiment, FIG. 5 depicts a structure with targeted thickness and doping of each layer made using the devices, techniques and methods disclosed herein. As depicted in FIG. 5, GaInP layers were grown at 2.3 µm/h for the etch stop and window and 6 µm/h for the BSF layers, and were the same for all experiments. In an embodiment, the growth rates exemplified herein refer to GaAs contact and base layers, as depicted in FIG. 5, for example. Solar cells were grown on (100) GaAs substrates offcut either 4°, 6° or 9° toward (111)B at growth rates from 35-309 µm/h. Device processing proceeded wherein Au was electroplated on the BSF, serving as a back contact as well as a back reflector to increase the optical path length of the device. This Au back contact was bonded to a Si handle using epoxy and the GaAs substrate and GaAs:Se buffer layer were removed by a selective chemical etch that stops at the GaInP etch stop layer. The front Au grid formation and 0.25 cm² square mesa isolation for solar cells and 0.7 mm² rectangular arrays for transmission line measurements were completed using standard photolithography processes. On selected samples, a $MgF_2$ (100 nm)/ZnS (52 nm) antireflection coating (ARC) was deposited in a thermal evaporator.

External quantum efficiency and reflectance were measured using a custom instrument which was used to calibrate a XT10 solar simulator to the air mass 1.5G spectrum, under which current density-voltage (J-V) characteristics of the devices were measured. Deep-level transient spectroscopy (DLTS) measurements were performed on select samples to quantitate the effect of growth rate on the trap type and density. The DLTS system used herein uses Fourier transforms to characterize full capacitance transients with a reverse bias voltage of −5.0 V, a trap filling pulse of 0.70 V and a pulse width of 1.0 msec for these measurements. The DLTS measurements were performed on 0.7 mm² devices with the same structure as the solar cells.

Growth Rate Determination

There are several factors that affect the growth rate in the mass-transport-limited HVPE growth parameter space. In an embodiment, the first is the efficiency of the GaCl conversion reaction from HCl and Ga. In an embodiment, the efficiency is governed by the temperature in the source region, 800° C., for example, but also by the residence time of the HCl in the Ga boat if the kinetics of the HCl to GaCl conversion reaction are not sufficiently fast. The HCl residence time in the Ga source boat is defined predominantly by the flow of $H_2$ carrier gas that pushes the HCl through the boat, $Q_{H_2}^{Ga}$.

Figure 6A:
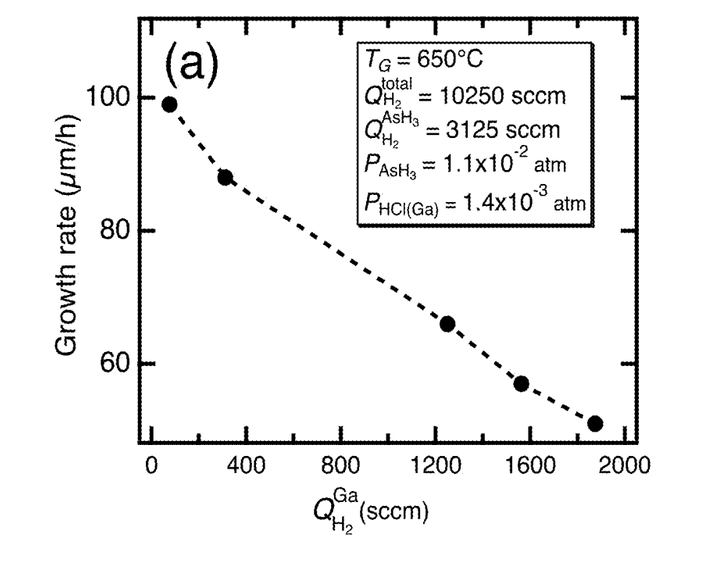
FIGS. 6(a) and 6(b) depict GaAs growth rate as a function of (a) H₂ carrier flow rate through the Ga boat and (b) partial pressure of HCl(Ga) sent to the boat. Other growth parameters are depicted in each figure and the total reactor flow was held constant.

FIG. 6(a) depicts an embodiment in which reducing the $H_2$ flow rate through the Ga boat is useful as a method for determining specific growth rates over a wide range while changing only one parameter. The reduced carrier flow permits the generation of more GaCl for a given HCl flow rate and thus minimizes the amount of free HCl in the reactor. In an embodiment, increased use of reactants was achieved because free HCl, which would otherwise suppress the growth rate through the reverse reaction (etching of GaAs), is reduced. As depicted in FIG. 6(a), all other growth parameters, i.e. the substrate temperature, the HCl flow rate through the Ga boat, the $AsH_3$ flow, and the total system $H_2$ carrier flow of about 10250 sccm, were held constant. Decreasing $Q_{H_2}^{Ga}$ from 2000 sccm to 75 sccm increased the growth rate from about 50 µm/h to about 100 µm/h. Without being limited by theory, the increase in the growth rate is attributed to an increase in the conversion of Ga to GaCl as the $H_2$ flow rate, and gas velocity through the Ga boat is reduced.

Figure 6B:
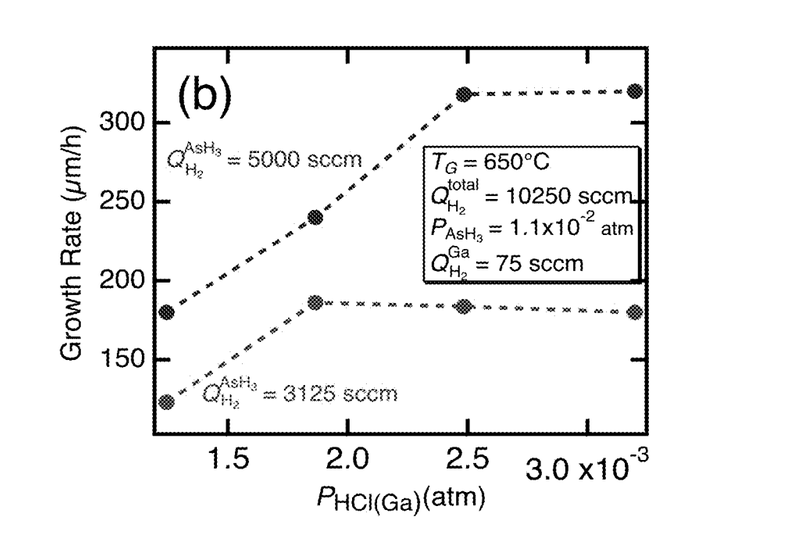

In an embodiment, the second factor affecting growth rate is the mass transport of reactants to the growth surface. FIG. 6(b) depicts the effect of increasing the GaCl partial pressure by varying the HCl flow rate through the Ga boat, using the $Q_{H_2}^{Ga}$=75 sccm conditions as discussed above. The green data in FIG. 6(b), which use a $H_2$ carrier gas flow through the $AsH_3$ inlet, $Q_{H_2}^{AsH_3}$=3125 sccm, show an initial increase in growth rate when the GaCl partial pressure increases from 0.8 to 1.7×10⁻³ atm. However, for higher GaCl partial pressures the growth rate may stagnate and then slightly decrease. This likely indicates that the growth rate is limited by a process whereby GaCl complexes compete with As species for adsorption sites at higher GaCl partial pressure.

In an embodiment, a third way to increase growth rate is to increase the $AsH_3$ carrier flow rate. FIG. 6(b) depicts that increasing $Q_{H_2}^{AsH_3}$ to 5000 sccm increases the growth rate for a given partial pressure of GaCl. The same saturation in growth rate is observed as for lower $Q_{H_2}^{AsH_3}$, but the effect is delayed to higher $P_{HCl(Ga)}$. Without being limited by theory, this could be due to the additional $AsH_3$ providing hydrogen radicals that reduce the Cl-containing complexes into HCl, or to the larger source of available As for a given supply of Ga, although the exact mechanism is currently unclear. In an embodiment, the growth rate increase was related only to an increase in $Q_{H_2}^{AsH_3}$ with constant GaCl and $AsH_3$ partial pressures resulting in greater source utilization efficiency at these high-growth-rate conditions.

In an embodiment, combining the three effects as discussed above, a maximum growth rate of about 320 µm/h at a GaCl partial pressure of 2.4×10⁻³ atm was obtained which is an improvement over existing GaAs growth rates of 300 µm/h obtained in different HVPE system having pressure of about 0.10 atm. Thus, in an embodiment, the greater than 300 µm/h growth rates obtained by using the methods disclosed herein at atmospheric pressure is beneficial at least because high vacuum conditions impose stricter design requirements on reactor materials and physical shape, and are typically more expensive to operate than atmospheric pressure systems disclosed herein.

Solar Cell Performance as a Function of Growth Rate

Figure 7A:
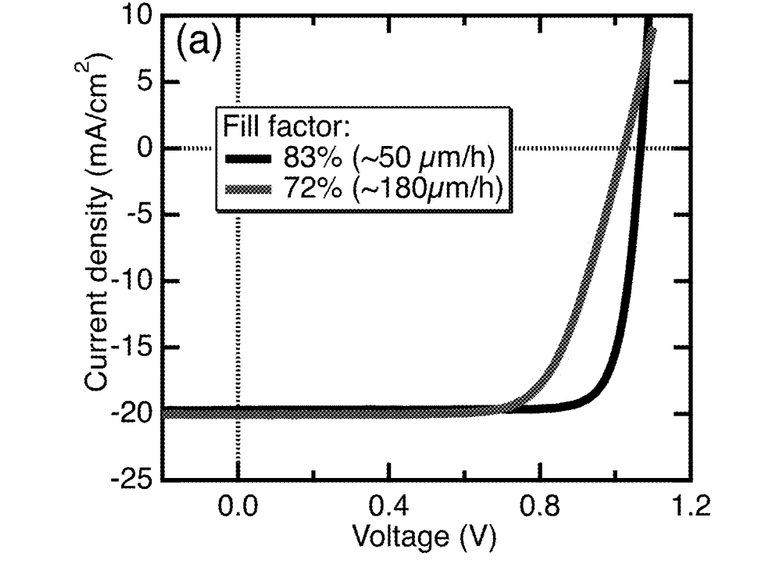

The effect of high growth rate on solar cell design and material quality by using high-growth-rate MOVPE GaAs solar cells is demonstrated, for example, by measuring Si and Zn dopant incorporation efficiency in the GaAs and was shown to increase as the growth rate increased requiring altering of dopant flows. FIG. 7(a) compares the J-V curves of two D-HVPE-grown GaAs solar cells with GaAs:Se contact layers grown at different growth rates, but with the same $H_2Se$ flows. The fill factor of the device with the high-growth-rate contact layer suffers from increased series resistance compared to the device with the slower contact layer. Transmission line measurements indicated that the increased series resistance occurs at the metal/semiconductor interface, and not elsewhere in the device. Without being limited by theory, this effect is likely due to a simple reduction in volumetric dopant density because the same amount of dopant disperses in more matrix material deposited per unit time, and, in an embodiment, can be an impediment to making high-efficiency devices.

Figure 7B:
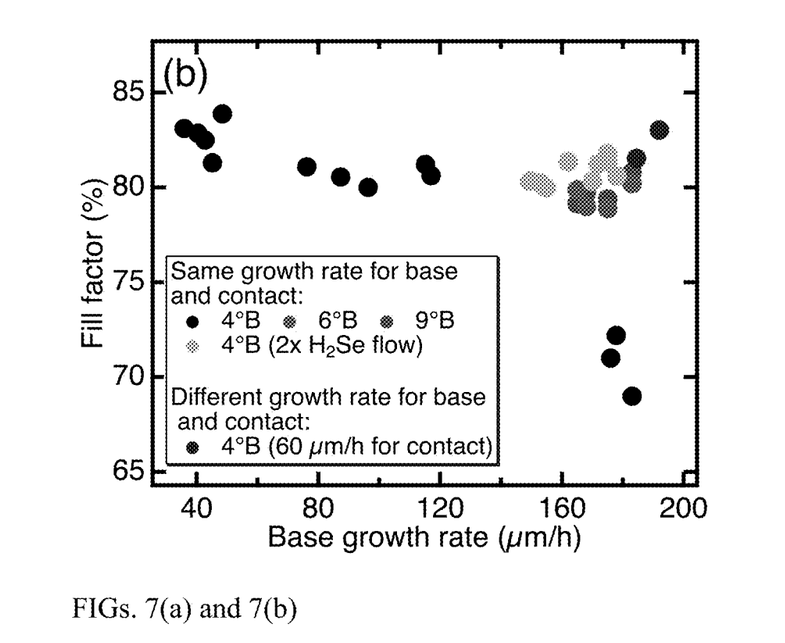
FIG. 7(b) depicts a fill factor of GaAs solar cells grown on substrates miscut 4°, 6° and 9° towards (111)B, either with the same growth rate used in the contact and base layers, or a slower contact growth rate (blue circles).

In an embodiment, single junction GaAs solar cell structures were grown with the same $H_2Se$ dopant flow but different growth rates to investigate this effect. FIG. 7(b) depicts the fill factor measured from the J-V curves for samples grown on (100) substrates miscut 4° toward (111)B (black circles) as a function of growth rate. The same growth rate was used for the contact and the base layer in this sample set. In an embodiment, this is the simplest arrangement in the D-HVPE reactor disclosed herein because constant reactant flows can be used in the GaAs deposition chamber for the entire device run. The fill factor decreases with contact growth rate, as depicted in FIG. 7(a).

In an embodiment, three methods were used to recover lost fill factor that focused on the region of contact growth rates at around 180 µm/h. The first was to increase the $H_2Se$ dopant flow from 6 sccm to 12 sccm (gold circles in FIG. 7(b)), which increased the fill factor to greater than 80%, up from about 70%. The second method was to use a hybrid growth rate structure, where base layers were grown at rates of about 180 µm/h, but the contact layer growth rate was slowed to about 60 µm/h. This approach requires a change in the reactant flows in the GaAs deposition chamber after deposition of the contact layer, before the base is grown. This approach was similarly effective (blue circles in FIG. 7(b)). The last approach was to use higher substrate miscuts (6° B and 9° B) than 4° B substrates. Without being limited by theory, the additional group V terminated surface steps/kinks present with these higher miscuts enhance the adsorption and incorporation of Se atoms. To verify this effect, a set of GaAs epilayers were grown on substrates with varying miscut towards (111)B with a $H_2Se$ flow of 6 sccm and a growth rate of 100 µm/h. Carrier concentrations, derived from room temperature Hall effect measurements, increased from $5.0\times10^{18}$ to $1.0\times10^{19}$ to $1.3\times10^{19}$ $cm^{-3}$ when increasing the miscut from 4° to 6° to 9°, respectively. The fill factors of the solar cells grown with 6° B and 9° B miscut substrates with 6 sccm $H_2Se$ flow and 180 µm/h contact layers (green and red circles in FIG. 7(b)) are also about 10% (absolute) higher than the devices with 4° B miscuts.

Figure 8:
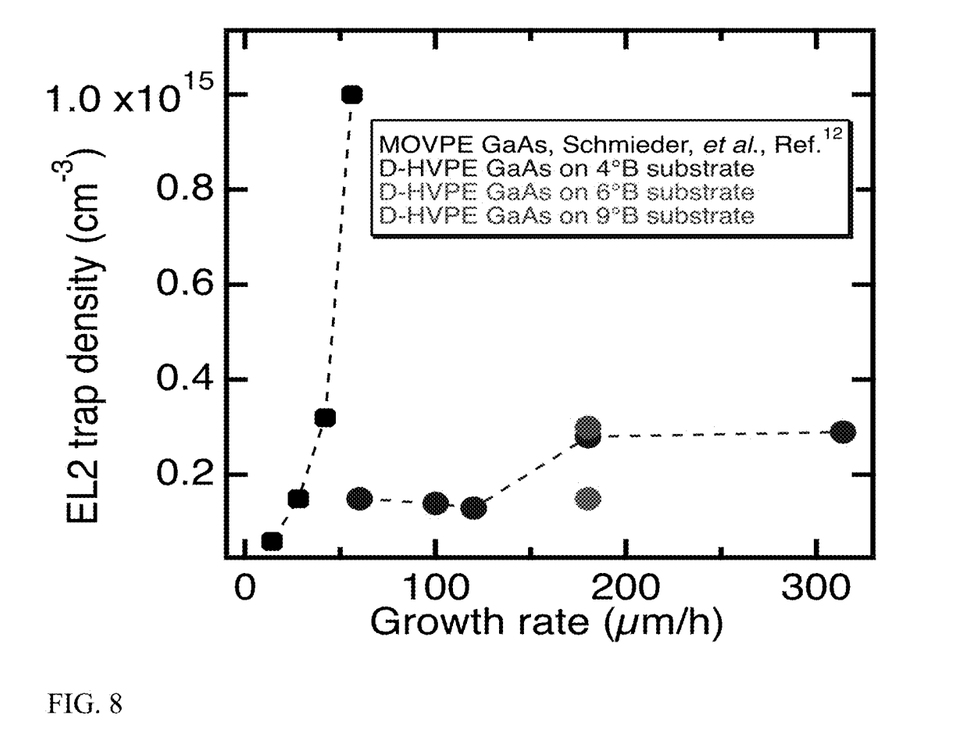
FIG. 8 depicts EL2 trap density measured using DLTS as a function of growth rate for GaAs solar cells grown by D-HVPE. Results from previously existing MOVPE devices are depicted for comparison.

In an embodiment, DLTS measurements were performed on GaAs devices grown by D-HVPE at rates from 50-309 µm/h on 4° B miscut substrates and on devices grown at 180 µm/h on 6° B and 9° B miscut substrates to determine the effect of growth rate on EL2 concentrations in HVPE. The activation energy of the traps observed in the D-HVPE-grown samples was about 0.82 eV, indicating an EL2 defect, and no other traps were identified. FIG. 8 depicts the measured EL2 trap density for D-HVPE GaAs solar cells as a function of both growth rate and miscut angle. There is no clear trend with substrate miscut and, unlike the MOVPE data, the trap density does not vary significantly with growth rate. As depicted in FIG. 8, the substrates grown using methods and reactors disclosed herein exhibited EL2 trap densities of less than about $0.4\times10^{15}$ $cm^{-3}$ at growth rates up to about 320 µm/h.

To verify the quality of high growth rate HVPE material, a series of GaAs solar cells were grown using D-HVPE with widely varying growth rates (from about 35-309 µm/h). The time required to grow a 2 µm-thick base layer at 309 µm/h was approximately 23 s, which is about 20× shorter than what it takes at a standard MOVPE growth rate. FIG. 9 displays the open-circuit voltage (VOC), fill factor (FF), short circuit current density (JSC), and efficiency (Eff) extracted from J-V measurements for the full series of solar cells as a function of growth rate, using rates from about 35-309 µm/h on 4° B miscut substrates, and from about 84-200 µm/h on 6° B and 9° B miscut substrates in which none of the devices had an ARC applied.

Figures 9A, 9B, 9C, 9D:
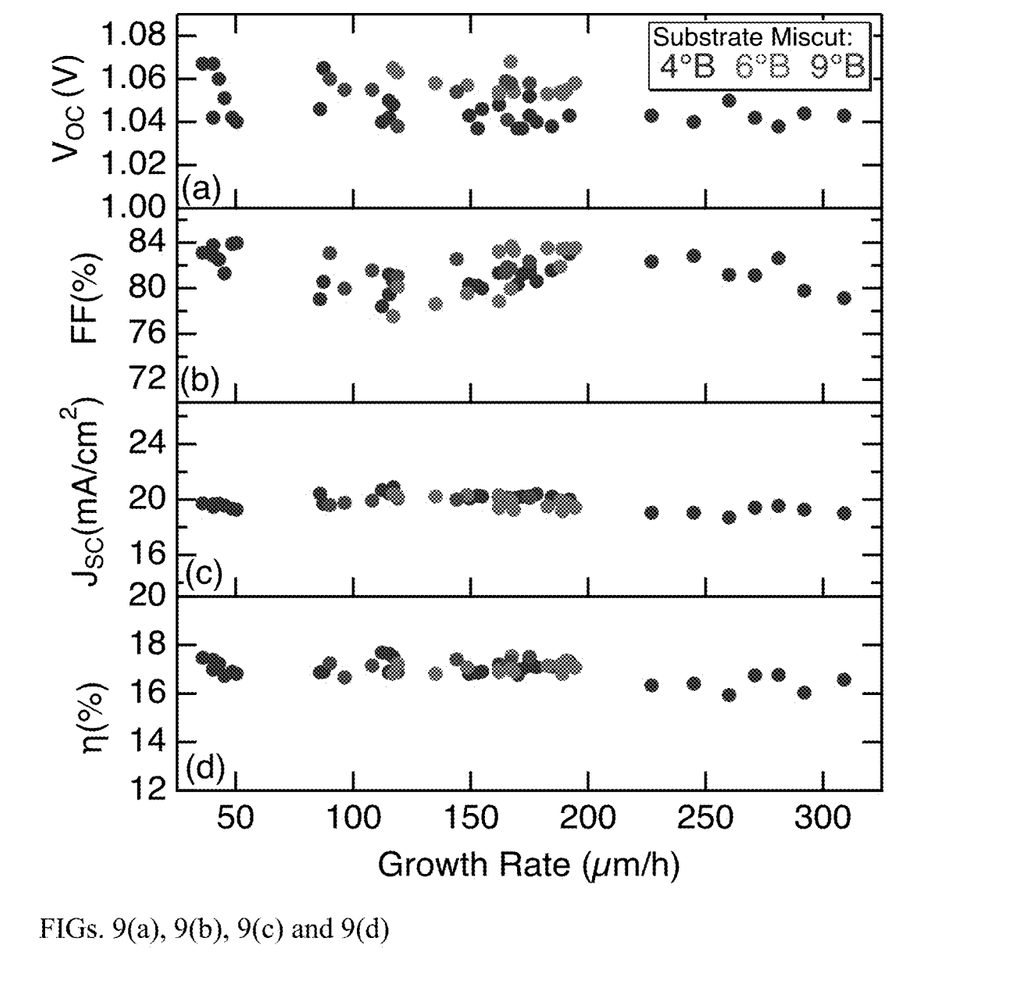
FIGS. 9(a), 9(b), 9(c), and 9(d) depict open circuit voltage (VOC), fill factor (FF), short circuit current (JSC) and efficiency (η), respectively, of solar cells grown at various growth rates on different miscut (4° B, 6° B, and 9° B) substrates. All measurements were without antireflection coating and under the AM1.5G illumination condition.

FIG. 9(a) depicts the VOCs for all of these devices fall in the range from 1.04-1.07 V. Without being bound by theory, VOC is an indicator of the quality of the active layers in a solar cell because it reflects negative contributions from non-radiative recombination and these devices are only about 50-80 mV lower than record GaAs devices. The devices were not optimized at each growth rate, i.e. the same growth recipe was used for each of the samples shown in FIG. 9 up to about 200 µm/h. The one change made in devices grown at rates greater than about 200 µm/h was to increase the $H_2Se$ flow in order to counteract the previously observed decrease in Se incorporation. Without being bound by theory, although this approach led to very comparable results in terms of all cell performance metrics, i.e., open-circuit voltage, fill factor, short-circuit current density and efficiency, continued optimization of the very-high-growth rate cells may lead to essentially identical performance for the entire range of growth rates.

Figure 10B:
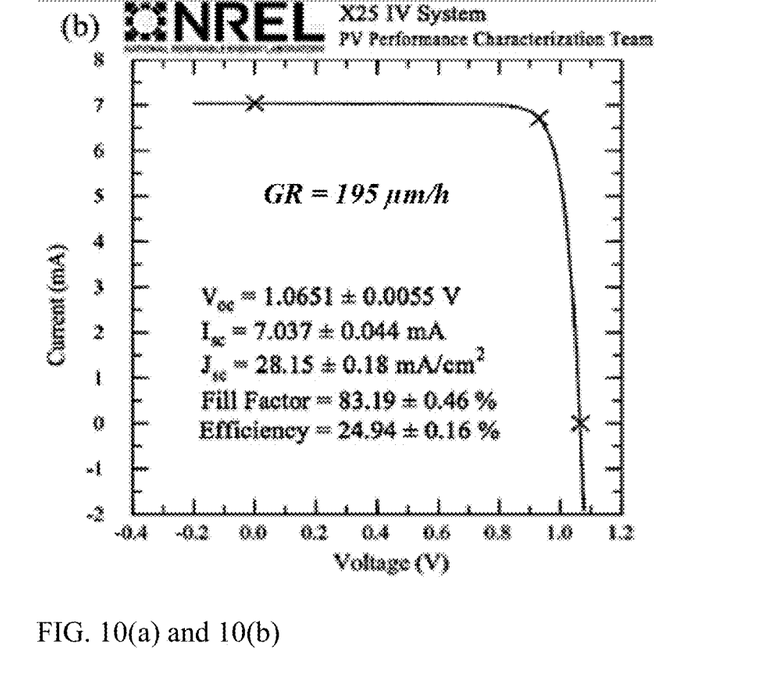

FIG. 10 depicts two NREL-certified I-V measurements comparing (a) a GaAs solar cell grown on a 4° B miscut substrate at 50 µm/h with (b) a similar solar cell grown on a 6° B miscut substrate at 195 µm/h, with both devices achieving efficiencies of about 25%. As discussed above, the change in the miscut angle only helped to enhance the dopant incorporation and improves the contact resistance, but does not otherwise affect device performance as can also be seen in FIG. 9. FIG. 10 depicts, however, the insensitivity of the D-HVPE process to the large growth rate range. Thus, in an embodiment, in D-HVPE the growth rate has no appreciable influence on the performance of solar cells.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A method for growing at least one layer of a semiconductor device using a reactor comprising boats containing group III metals, a group V hydride gas, a low temperature growth region and a high temperature region wherein the method comprises hydride vapor phase epitaxy (HVPE), and heating the group V hydride gas to a temperature of at least 750° C., and growing the at least one layer of a semiconductor device in the low temperature growth region wherein the low temperature growth region is below 650° C.; and wherein the at least one layer of a semiconductor device is a single-junction GaAs solar cell having an efficiency of 25% or greater.

2. The method of claim 1 wherein the at least one layer of a semiconductor device is grown at a rate of greater than 300 µm/h at a pressure of 1 atm.

3. The method of claim 1 wherein the at least one layer of a semiconductor device has a band gap voltage offset ($W_{OC}$) of less than 0.4V.

4. The method of claim 1 wherein the at least one layer of a semiconductor device has a band gap voltage offset ($W_{OC}$) of less than 0.33V.

5. A method for growing at least one layer of a semiconductor device using a reactor comprising boats containing group III metals, a group V hydride gas, a low temperature growth region and a high temperature region wherein the method comprises hydride vapor phase epitaxy (HVPE), and heating the group V hydride gas to a temperature of at least 750° C., and growing the at least one layer of a semiconductor device in the low temperature growth region wherein the low temperature growth region is below 650° C.; and wherein the at least one layer of a semiconductor device has a EL2 trap density of less than $0.4 \times 10^{15}$ cm$^{-3}$ at growth rates up to 320 µm/h.

6. The method of claim 5 wherein the at least one layer of a semiconductor device is grown at a rate of greater than 300 µm/h at a pressure of 1 atm.

7. The method of claim 5 wherein the at least one layer of a semiconductor device has a band gap voltage offset ($W_{OC}$) of less than 0.4V.

8. The method of claim 5 wherein the at least one layer of a semiconductor device has a band gap voltage offset ($W_{OC}$) of less than 0.33V.

9. The method of claim 5 wherein the at least one layer of a semiconductor device is a single-junction GaAs solar cell having an efficiency of 25% or greater.

* * * * *